(12) United States Patent
Luttikhuis et al.

(10) Patent No.: US 6,977,713 B2
(45) Date of Patent: Dec. 20, 2005

(54) LITHOGRAPHIC APPARATUS AND DEVICE MANUFACTURING METHOD

(75) Inventors: Bernardus Antonius Johannes Luttikhuis, Nuenen (NL); Pertrus Rutgerus Bartray, Ysselsteyn (NL); Wilhelmus Josephus Box, Eksel (BE); Martinus Hendrikus Antonius Leenders, Rotterdam (NL); Marc Wilhelmus Maria Van Der Wijst, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 69 days.

(21) Appl. No.: 10/729,376

(22) Filed: Dec. 8, 2003

(65) Prior Publication Data

US 2005/0122490 A1    Jun. 9, 2005

(51) Int. Cl.[7] .......................... G03B 27/42; G03B 27/52
(52) U.S. Cl. .......................... 355/30; 355/53
(58) Field of Search .................... 355/30, 53

(56) References Cited

U.S. PATENT DOCUMENTS

| | | |
|---|---|---|
| 5,877,843 A | 3/1999 | Takagi et al. |
| 6,509,951 B2 * | 1/2003 | Loopstra et al. .............. 355/30 |
| 2001/0050759 A1 | 12/2001 | Kamiya |
| 2004/0156026 A1 | 8/2004 | Kamiya |
| 2005/0073663 A1 * | 4/2005 | Miyajima .................... 355/30 |

FOREIGN PATENT DOCUMENTS

| | | |
|---|---|---|
| EP | 1 029 510 A1 | 9/2000 |
| EP | 1 124 161 A2 | 8/2001 |
| EP | 1 124 161 A3 | 7/2004 |
| WO | WO 02/054460 A1 | 7/2002 |

* cited by examiner

*Primary Examiner*—Rodney Fuller
(74) *Attorney, Agent, or Firm*—Pillsbury Winthrop Shaw Pittman LLP

(57) ABSTRACT

A lithographic apparatus includes an illumination system for providing a beam of radiation, a support structure constructed to support a patterning device, which serves to impart the projection beam with a pattern in its cross-section, a substrate table for holding a substrate, a projection system that projects the patterned beam onto a target portion of the substrate, and a reference frame with a position sensor and the substrate being located thereon. The apparatus further includes a heat transport system having a heating element, in thermal interaction with at least one of the projection system and the reference frame, for heat transport to or from at least one of the projection system and the reference frame, wherein the heat transport system, is coupled to a further frame which is mechanically isolated from the reference frame.

25 Claims, 3 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In lithographic apparatuses the size of features that can be imaged onto the wafer is limited by the wavelength of the projection radiation. To produce integrated circuits with a higher density of devices and hence higher operating speeds, it is desirable to be able to image smaller features. Whilst most current lithographic projection apparatuses employ ultraviolet light generated by mercury lamps or excimer lasers, it has been proposed to use shorter wavelength radiation of around 13 nm. Such radiation is termed extreme ultraviolet (EUV) or soft x-ray. Other proposed radiation types include electron beams and ion beams. These types of beam share with EUV the requirement that the beam path, including the mask, substrate and optical components, be kept in a vacuum. When sub-micron accuracy is required, even very small disturbances can be damaging. In conventional lithographic apparatuses, dynamic heat loads within the apparatus resulting in thermo-mechanical deformations of critical components, such as a reference frame which provides multiple functionalities and requires a highly stable environment and a projection system, continue to cause problems with imaging accuracy. However, these problems are further exacerbated in lithographic apparatuses having a projection beam at shorter wavelengths, such as EUV, because the high vacuum required make it difficult to sink absorbed heat and involve relatively high absorption.

It is an advantage of an embodiment of the present invention to address the problems associated with heat loads in lithographic apparatuses, resulting in thermo-mechanical deformations of critical components.

It is an advantage of an embodiment of the present invention to improve the thermal stability of critical components by reducing the thermal drift of the reference frame and optical components mounted on the reference frame, resulting in a decrease of relative displacements of the measurement system with respect to each other and with respect to the optical system. Furthermore it is an advantage of an embodiment of the present invention to improve the dynamic performance by the thermal shielding of the reference frame and optical system, since the required active thermal conditioning capacity of the reference frame and optical system can be reduced.

SUMMARY OF THE INVENTION

According to an aspect of the present invention, there is provided a lithographic apparatus comprising:

an illumination system constructed to provide a beam of radiation;

a support structure constructed to support a patterning device, the patterning device serving to impart a cross-section of the beam with a pattern to form a patterned beam of radiation;

a substrate table for holding a substrate;

a projection system that projects the patterned beam onto a target portion of the substrate;

a reference frame, with a position sensor and the substrate being located on the reference frame;

a heat transport system having a heating element in thermal interaction with at least one of the projection system and the reference frame for heat transport to or from at least one of the projection system and the reference frame; and a further frame on which the reference frame is mounted, wherein the further frame is provided with a vibration isolation system having a vibration damper adapted to prevent vibrations in the further frame from affecting the reference frame, and the heat transport system being coupled to the further frame.

By providing a heat transport system and by coupling the heat transport system to a further frame which is mechanically isolated from the reference frame, vibrations induced by heat transport, in particular, caused by the movement of fluids in the heat transport system, are isolated from the reference frame. Thus, the thermal stability of the reference frame is improved due to the heat transport to or from either the projection system or the reference frame itself, yet it is not subject to any mechanical disturbances caused by the heat transport system. This results in an improved imaging quality. When heat transport is carried out to or from the reference frame, this results in a further improvement of thermal stability of the reference frame, which further improves imaging quality. Overall, the moving average and the moving standard deviation is decreased, representing an improvement in overall performance. It is noted that the moving average is affected by low frequency disturbances, such as thermal drift, and the moving standard deviation is affected by high frequency disturbances, such as vibrations.

According to an aspect of the present invention, there is provided a lithographic apparatus comprising:

an illumination system constructed to provide a beam of radiation;

a support structure constructed to support a patterning device, the patterning device serving to impart a cross-section of the beam with a pattern to form a patterned beam of radiation;

a substrate table for holding a substrate;

a projection system that projects the patterned beam onto a target portion of the substrate;

a reference frame, with a position sensor and the substrate being located on the reference frame; and a heat transport system having a heating element in thermal interaction with the reference frame for heat transport to or from the reference frame.

By providing a heat transport system to transfer heat to or from the reference frame, the thermal environment of the reference frame is conditioned. In a preferred embodiment, the further frame defines at least a part of a vacuum chamber in which at least one of the projection system and the reference frame are located.

By coupling the heat transport system to a further frame which defines at least part of a vacuum chamber use of existing structures is made, which does not increase the complexity of the apparatus. Since the projection system and the reference frame are located in the vacuum chamber, it is not necessary to provide any additional structures which may compromise the integrity of the vacuum.

In a preferred embodiment, at least one heat radiation shield is located to intercept heat radiation to or from at least a part of a surface of the reference frame.

By providing a heat shield around at least a part of the reference frame, the thermal stability of the reference frame is further improved. By providing shielding, the heat transport capacity required is reduced. By reducing the amount of heat transport required, the dynamic stability is improved and the risk of fluid leakage from the heat transport system in the apparatus, in particular, the vacuum chamber is reduced.

In a preferred embodiment, the heat shield comprises at least a partially reflective surface, arranged to reflect radiation away from the reference frame.

By providing a reflective surface to reflect radiation away from the reference frame, the thermal stability of the reference frame is further improved, thus further reducing the capacity of heat transport required, and thereby reducing the risk of fluid leakage in the apparatus.

In a preferred embodiment, the heat shield is arranged to shield a part of the reference frame which exhibits a stiffness which is high in relation to another part of the reference frame.

By selectively shielding certain parts of the reference frame, the optimum thermal stability can be achieved without substantially increasing the complexity of the apparatus.

In a preferred embodiment, the heat transport system is in thermal interaction with the heat radiation shield for transporting heat to or from the reference frame via the shield.

By disposing the heat transport system in thermal interaction with the shield, the thermal stability of the reference frame is further improved without subjecting the reference frame to any vibrational disturbances that may arise by disposing the heat transport system in direct thermal interaction with the reference frame.

In a preferred embodiment, the heat transport system comprises a supply element and an abduction element for supplying and abducting, respectively, a fluid for transporting heat to or from at least one of the reference frame and the projection system, wherein at least one of the supply and abduction elements are mounted on the further frame. It has been found that the movement of the fluid in the elements is a major source of vibrational disturbances. Thus, by coupling these elements, in particular, to a further isolated frame, a major source of vibrational disturbances on at least one of the projection system and the reference frame, is removed.

In a preferred embodiment, the heat system comprises a plurality of heat shields arranged to surround at least a portion of the reference frame, wherein the heat transport system is arranged to substantially enclose a volume of a thermally insulating substance between the reference frame and the heat transport system to act as a thermal damper.

In this way, the dynamic heat load towards the reference frame is damped significantly.

According to an aspect of the present invention, there is provided a method of manufacturing a device comprising:

providing a substrate;
providing a beam of radiation;
imparting a cross-sectional pattern to the beam and forming a patterned beam of radiation;
projecting the patterned beam of radiation onto a target portion of the substrate using a projection system supported by a reference frame, which is, in turn, supported by further frame;
using a vibration isolation system to prevent vibrations in the further frame from affecting the reference frame; and
transporting heat to or from at least one of the projection system and the reference frame using a heat transport system arranged to be in thermal interaction with at least one of the projection system and the reference frame.

According to an aspect of the present invention, there is provided a method of manufacturing a device, comprising:

providing a substrate;
providing a beam of radiation;
imparting a cross-sectional pattern to the beam and forming a patterned beam of radiation;
projecting the patterned beam of radiation onto a target portion of the substrate using a projection system supported by a reference frame; and
transporting heat to or from the reference frame using a heat transport system arranged to be in thermal interaction with the reference frame.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
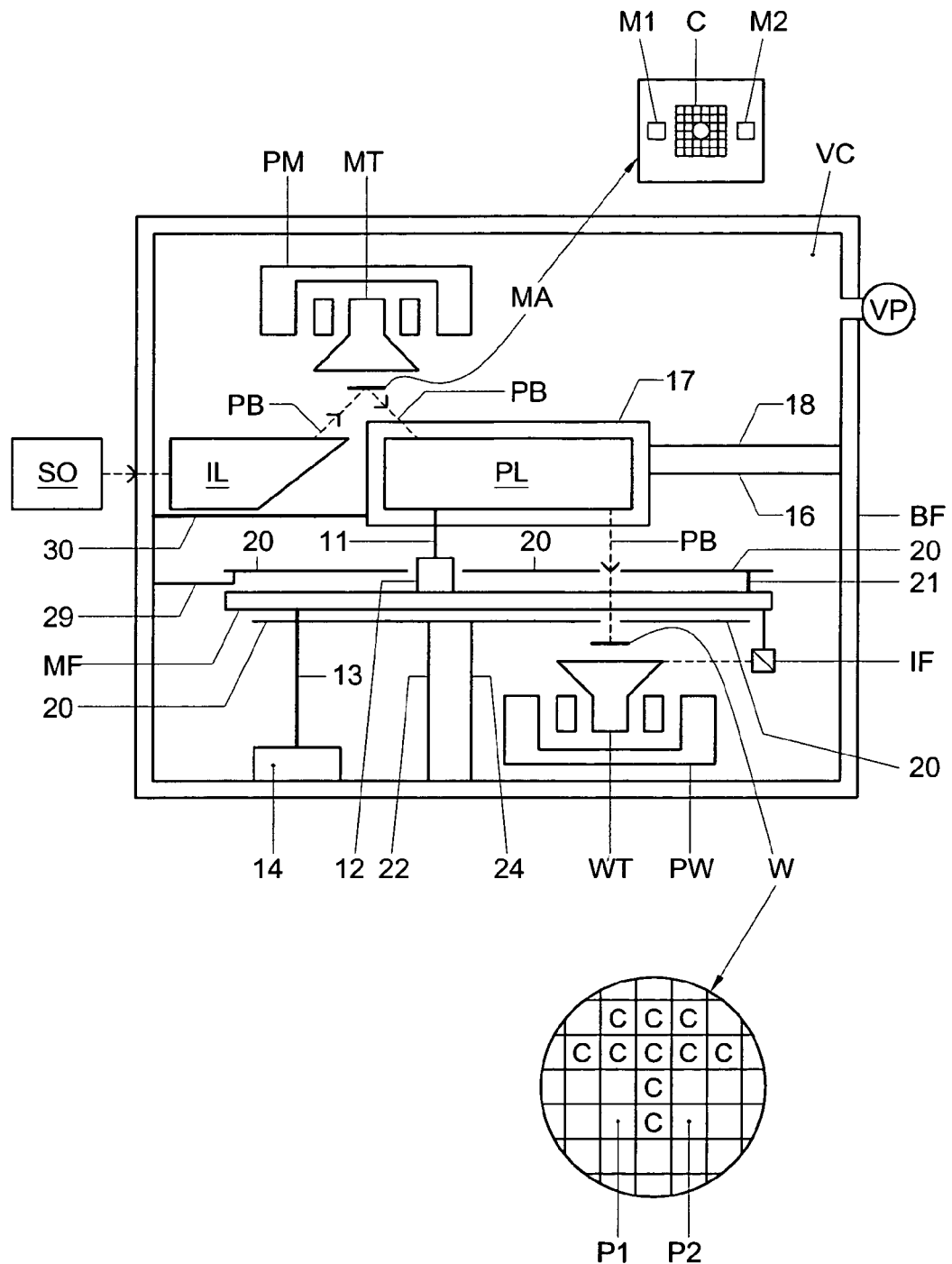
FIG. 1 depicts a lithographic apparatus according to an embodiment of the invention.

FIG. 1 schematically depicts a lithographic apparatus according to a particular embodiment of the invention.

The apparatus comprises: an illumination system (illuminator) IL for providing a projection beam PB of radiation (e.g. UV or EUV radiation).

a first support structure (e.g. a mask table) MT for supporting patterning device (e.g. a mask) MA and connected to first positioning means PM for accurately positioning the patterning device with respect to item PL;

a substrate table (e.g. a wafer table) WT for holding a substrate (e.g. a resist-coated wafer) W and connected to second positioning means PW for accurately positioning the substrate with respect to item PL; and a projection system (e.g. a reflective projection lens) PL for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting means for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning means PW and position sensor IF (e.g., an interferometric device), the substrate table WT can be moved accurately, e.g. so as to position different target portions C in the path of the beam PB. Similarly, the first positioning means PM and its corresponding position sensor (e.g., an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the magnification/demagnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic projection apparatus of the example includes a vacuum chamber VC in which the beam PB impinges on a patterning device, illustrated in the form of mask MA and subsequently onto the target area of the substrate W. The vacuum chamber VC encloses at least one component selected from a group comprising the support structure, the substrate table, the projections system and the reference frame. In the embodiment shown in FIG. 1, the vacuum chamber additionally may include the illuminator IL, the patterning device MA, the substrate W and the sensors IF disposed on the reference frame MF for sensing the position of the patterning device MA and substrate W, respectively. A vacuum pump VP is associated with the vacuum chamber. The vacuum pump VP creates at least a partial vacuum, and typically a high vacuum within the vacuum chamber VC. At least part of the vacuum chamber VC is defined by a base frame BF. The reference frame MF and the base frame BF are discussed in further detail below.

Within a lithographic apparatus, regardless of whether it includes a vacuum chamber or not, various heat transport systems may be provided to condition the thermal environment of components within the apparatus. The heat transport systems may comprise different components, including heat shields, for example a so-called passive heat and/or so-called active heat shield. A passive heat shield is typically a plate without active temperature conditioning, in a preferred embodiment the plate is highly reflective for radiation on both sides. For example, it typically has an emissivity in the region of 0.1 or less. In an active heat shield, the temperature of this shield is actively conditioned and controlled. In a preferred embodiment the plate may be highly reflective for radiation towards the outer side of the temperature critical part. For example, it may have an emissivity in the region of 0.1 or less, and will be highly emissive towards the temperature critical part. For example, it may have an emissivity in the region of 0.7 or more, since this will help control the temperature of the temperature critical part. The heat transport systems of the present invention may include, but are not limited to, active and passive heat shield. Examples for controlling the active heat shield temperature include, but are not limited to providing a forced flow of a temperature controlled media through channels in or on top of the plate, or by providing a flow of a cold media through the plates and actively controlled heaters at the media supply or directly at the shields, for the temperature control a temperature sensor and control loop will be required, or by providing a temperature controlled plate by using thermoelectric (Peltier) elements, or by using heat pipes to control the heat shield temperatures.

In the description herein below, when a heat shield is mentioned it may be passive or active or both, unless, in the particular embodiment explicitly mentions a particular type. It has been found that vibrations cause problems when one or more active heat shields are used. Whereas, it has been found that passive heat shields may be mounted on either the base frame or/and the reference frame, active heat shields are preferably mounted on the base frame.

The reference frame MF, is also known as a so-called "metrology" frame. The reference frame MF provides a reference surface with respect to which at least one of the patterning device and wafer are measured, and is mechanically isolated from the main apparatus structure. In particular, the reference frame MF is isolated by a vibration isolation system 13, 14 from the base frame BF. The vibration isolation system includes a support 13 and a resilient member 14. In FIG. 1 only one support 13 and resilient member 14 are shown, however, a plurality of supports and resilient members 14 may be present. The reference frame MF is typically made of a material having a low coefficient of thermal expansion, such as Invar™. For example, in a preferred embodiment the coefficient of thermal expansion is in the region of $2.5 \cdot 10^{-6}$ $K^{-1}$ or less. The reference frame MF supports sensitive components such as position sensors like, for example, an interferometer IF. Additionally, depending on the particular lithographic apparatus, the reference frame may also support the projection system PL. Further, the reference frame MF isolates those components supported thereon from vibration. Whilst the reference frame MF supports a metrology system, such as interferometer IF, and typically also the projection system PL the base frame BF supports other components. The base frame BF provides two functions. On the one hand it defines at least a part of the vacuum chamber VC. One the other hand it supports certain apparatus components, such as the vibration isolation system 13, 14, the substrate table WT including the long stroke motor, and the support structure MT. In one embodiment, the base frame BF is in contact with the fabrication floor, alternatively, it is not.

It will be understood that the vibration isolation system 13, 14 may be realized in a number of alternative ways, with respect both to the nature of the system and the number and arrangement of the system components. For example, the resilient member 14 may be realised for example, as airmounts or other equivalent systems, such as a magnetic system, a mechanical system comprising low stiffness mechanical beams, a piezo-electric system, a fluid based system or any combinations thereof, which provide a resilient support for the reference frame MF with a low stiffness. It is noted that the airmounts are suitable for use in a lithographic apparatus operating under a vacuum. The reference frame MF may be built up from a monolithic part, in other words a solid block. It may be cast or machined out of one block. Even though the reference frame may be made of a material with a very low coefficient of thermal expansion, such as Invar (TM), the metrology frame and attached components should be kept isothermal, but if not the maximum temperature variation should optimally be less than typically 0.1 degrees Celsius.

It has been found that active heat transport, for example, fluid cooling or cooling using heat pipes, or any other form of means causing heat to be transported can be used to control the temperature of temperature critical components, such as the reference frame MF and the projection system PL. It has also been found that such active heat transport can be regulated by a control loop to keep the temperature stable. However, it has been found that this type of heat transport, when applied to the projection system PL or the reference frame MF may lead to mechanical vibrations that result in imaging errors, for example, due to forced cooling or to the required mechanical connections. Such problems are exacerbated when the heat transport capacity, typically the cooling capacity, requirements are increased. It has been found that when operating at shorter wavelengths, which require exposure to take place under vacuum conditions, the heat transport capacity is increased. The present invention, therefore addresses the further problems associated with heat transport systems, in particular ensuring the temperature stability of critical components, such as the projection system and the reference frame of a lithographic apparatus which are subject to active heat transport while minimizing the effect of mechanical vibration due to that heat transport.

The projection system PL may be supported on the reference frame MF via a support 11 and a resilient element 12. Although, FIG. 1 shows only one support 11 and resilient element 12, a plurality of supports and resilient members may alternatively be provided.

The reference frame MF is at least partially surrounded by a heat radiation shield 20. The heat shield is provided with a support 21, 29. The support 21 is mounted on either the reference frame MF or the base frame BF. The support 29 is mounted on the base frame BF. Whether the supports 21 and 29 are mounted on the base frame BF or the reference frame MF will depend on whether the shield provides active or passive shielding. In the situation that the heat shield 20 is provided with active cooling, active cooling support 29 is mounted on base frame BF. In the situation where the heat shield 20 provides passive cooling, passive cooling support 21 may be mounted on the reference frame MF, however, it may also be mounted on the base frame BF. In the situation, where heat shield 20 is adapted to provide both active and passive cooling active cooling support 29 and passive cooling support 21 are mounted on the base frame BF and the reference frame MF, respectively. The heat radiation shield 20 may be in thermal interaction with a heat transport system 22, 24. Typically, the heat transport system 22, 24 is located in the vicinity or adjacent the heat radiation shield 20. It may include a mounting element securing a part of the heat transport system 22, 24 to the heat radiation shield 20 to optimize the thermal interaction between the heat radiation shield 20 and the heat transport system 22, 24. Alternatively, the heat transport system 22, 24 may be formed as an integral part of the heat radiation shield 20, by embedding at least a part of the heat transport system 22, 24 in the heat radiation shield 20. The heat transport system includes a supply pipe 22 for heat transport fluid and an abduction pipe 24 for the heat transport fluid. The heat transport system 22, 24 is mounted on the base frame BF. In particular, the supply and abduction pipes 22, 24 are coupled to the base frame BF.

In a preferred embodiment the active heat shield 20 is integrated in the base frame BF. This is possible by having a very well conditioned base frame wall surrounding at least a part of the view of the reference frame.

The projection system PL may be surrounded by heat shields 17 which may also be provided with a heat transport system 16, 18 for heat transport to or from the projection system PL. The system may include a supply pipe 16 and an abduction pipe 18 which are mounted on the base frame BF.

The pipes 16, 18, 22, 24 are arranged to transport heat to or from the projection system PL and shield 20, respectively.

Although the words "heat transport" is used throughout for the fluid and the pipes 16, 18, 22, 24, it should be understood that under most circumstances pipes 16, 18, 22, 24 serve as cooling pipes and the fluid serves as cooling fluid, by removing excess heat through abduction pipe 18, 24. But it is also envisaged that the fluid may be used to maintain the projection system PL and the reference frame MF at a higher temperature than normally when no projection beam is present. It is also envisaged that a control loop (not shown) may be provided to regulate the temperature of the projections system PL and/or the reference frame MF. In this embodiment, one or more sensors, for example, a temperature dependent resistance, are provided on the projection system PL and/or the reference frame MF or shield 20. The temperature of the projection system PL and the reference system MF are controlled by regulating the temperature of the heat shields 17, 20. This may be done by circulating a temperature controlled medium, for example gas, fluid or a gas/fluid mixture, through the shields 17, 20 or through channels provided on the shield 17, 20. Further, the supply temperature of this medium may be actively controlled. In an alternative embodiment, a cold media is supplied to the heat shield 17, 20, wherein the heat shield temperature is regulated by additional heaters mounted on the shields 17, 20. In a further alternative embodiment, the the heat shield temperature may be controlled by using thermoelectric (Peltier) elements or by using heat pipes.

It will be understood that the heat transport system may comprise a circulating fluid or alternatively a through-flowing fluid in which fresh fluid is introduced through the supply pipe 16, 22. The fluid may comprise a liquid, gas or vapour or a mixture thereof. It will be understood that other forms of active cooling may be included to transfer heat to or from the projection system PL and/or metrology frame MF, such as heat pipes. In particular, a cooling system provides long term stability and fast temperature stabilization after temperature drift due to for example service or after installation.

Figure 2:
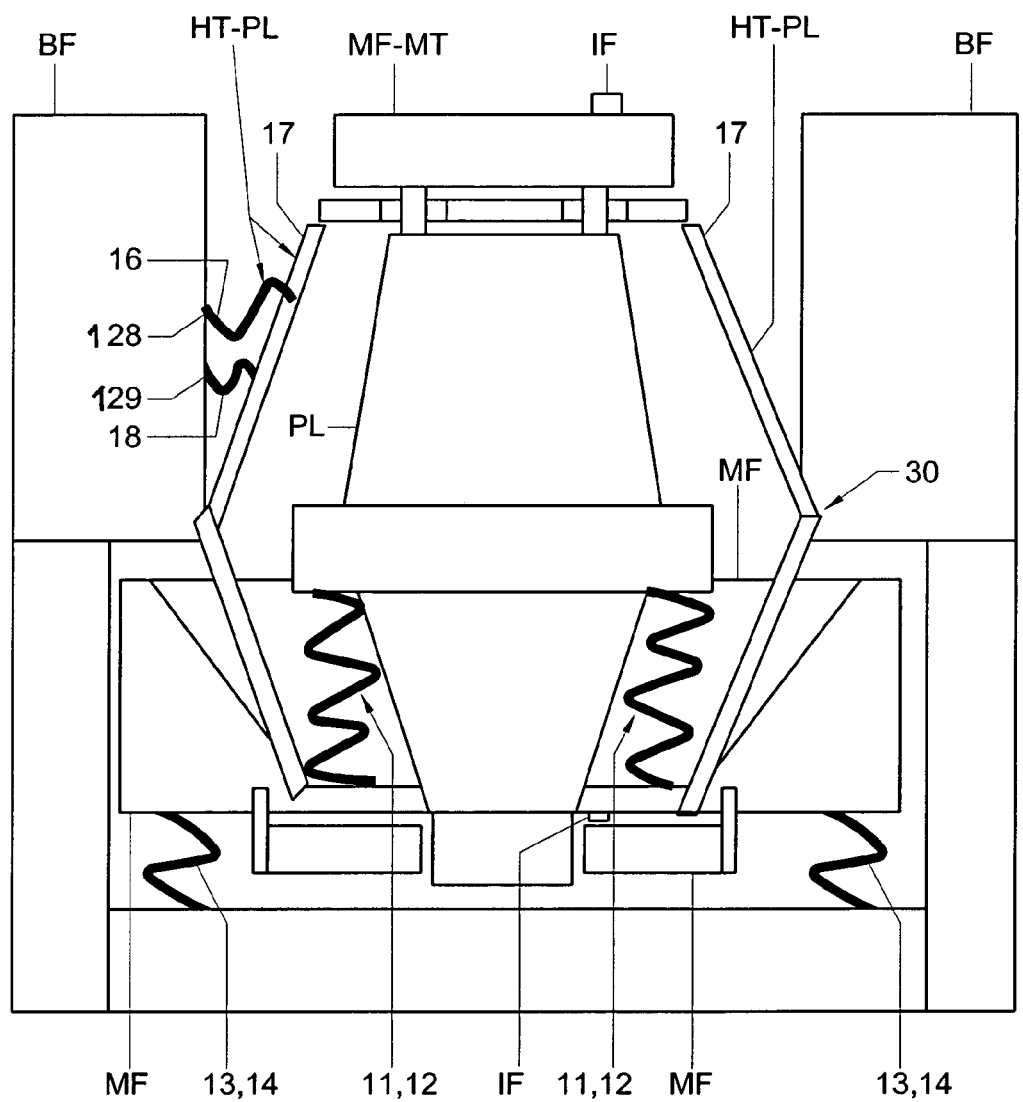
FIG. 2 depicts details of a lithographic apparatus shown in FIG. 1.

FIG. 2 depicts details of a lithographic apparatus shown in FIG. 1. In particular, FIG. 2 shows details of the heat transport system for transporting heat to or from the projection system HT-PL.

The heat transport system for the projection system includes a supply pipe 16 and abduction pipe 18 and a heat shield 17. The heat shield 17 is described in our copending European patent application Serial No. 03076433.6 filed on May 13, 2003 (Applicant Reference No. P-1558), and is herein incorporated by reference. Fluid for transporting heat to or from the projection system PL is introduced by supply pipe 16, passes through the active heat shield 17 and exits via abduction pipe 18. To avoid any vibrations caused by the flow of fluid through the pipes, the supply and abduction pipes are mounted on the base frame BF at respective locations 128, 129. In addition, the heat shield 17 is mounted by mounting element 30 on the base frame BF at a location. The projection system PL may be mounted on reference frame MF by support element 11 and resilient means 12, which are shown schematically in FIG. 2. The projection system PL includes a projection optics box in which the optical components, such as mirrors and other elements, such as sensors and actuators, are mounted. In the example shown, the projection optics box is mounted on the reference frame MF. The reference frame MF may comprise a support structure reference frame portion MF-MT on which a sensor, for example, an interferometer IF is mounted for sensing the position of the patterning device on the support structure. The support structure reference frame portion MF-MT is disposed on the projection optics box. The reference frame MF further comprises a substrate table reference frame portion on which a sensor, for example, an interferometer IF is mounted for sensing the position of the substrate on the substrate table WT. It is noted that the substrate table reference frame portion does not typically constitute a separate frame. The substrate table reference frame portion is attached to the portion of the reference frame MF on which the projection system PL is mounted. As described with reference to FIG. 1, the reference frame MF is mounted on a base frame BF. The reference frame MF is isolated from the base frame BF by virtue of a vibration isolation system 13, 14, shown schematically in FIG. 2, including at least one resilient member 14 as shown in FIG. 1. By isolating the reference frame MF from the base frame BF and coupling the heat transport system to the base frame BF, the benefits of the heat transport system in terms of thermal stability are achieved without introducing any vibrational disturbances to the reference frame MF. In this way the dynamic head loads in the vacuum chamber VC will not give rise to thermo-mechanical deformations of the reference frame MF.

Figure 3:
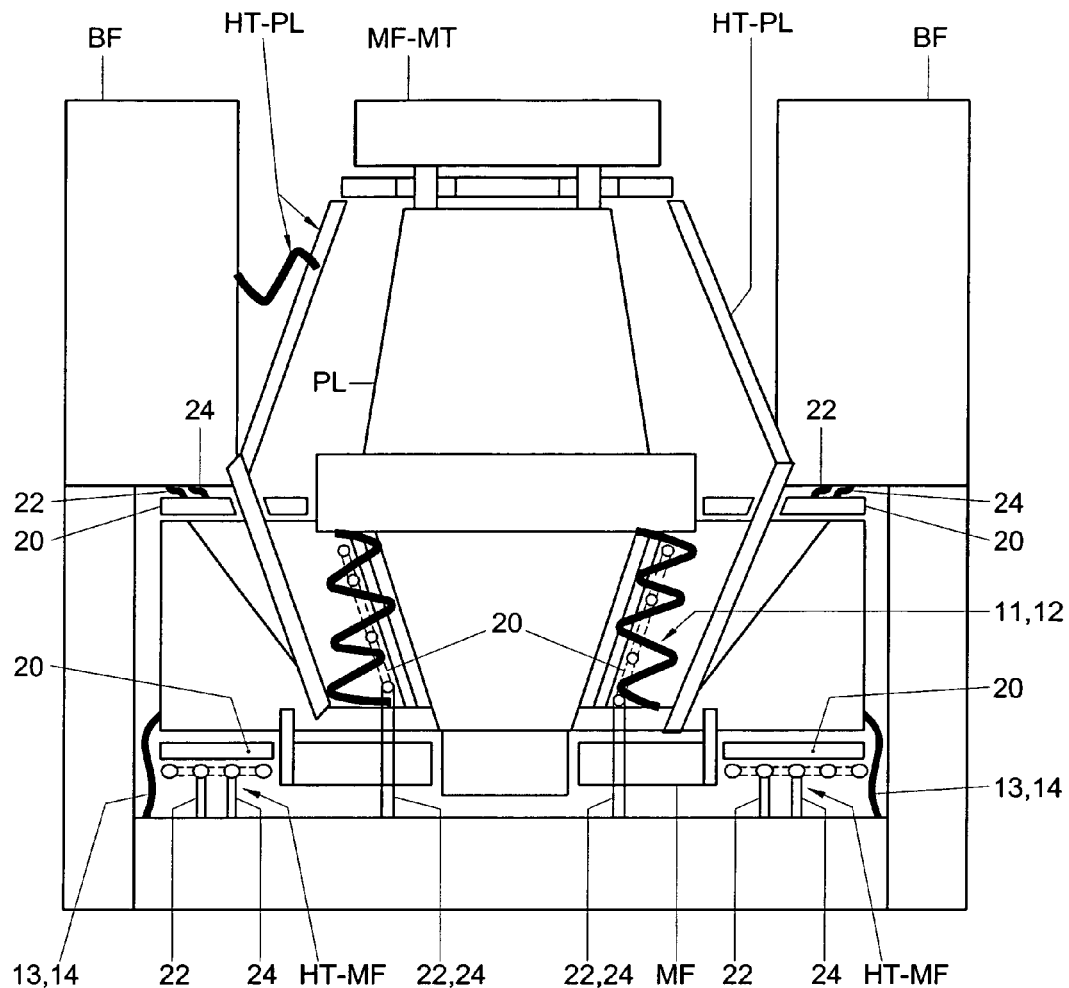
FIG. 3 depicts further details of a lithographic apparatus shown in FIG. 1.

FIG. 3 depicts further details of a lithographic apparatus shown in FIG. 1. In particular, FIG. 3 shows details of the heat transport system for transporting heat to or from the reference frame HT-MF and a heat radiation shield 20. Those components shown in FIG. 3 having the same reference numerals as components shown in FIG. 2, are not described again with reference to FIG. 3, reference is made to FIGS. 1 and 2 for a description of those components.

As with the heat transport system for the projection system HT-PL, the heat transport system for the reference frame MF comprises a supply pipe 22, an abduction pipe 24 and optionally a transport pipe (not shown). The supply pipe 22 introduces a fluid to the heat transport system and the abduction pipe 24 removes the fluid from the system. As with the heat transport system for the projection system HT-PL, the heat transfer system for the reference frame HT-MF is coupled to the base frame BF. In particular, supply pipe 22 and abduction pipe 24 are mounted on the base frame BF. FIG. 3 further shows that the lithographic apparatus comprises at least one heat radiation shield 20, located to intercept heat radiation to or from at least a part of a surface of the reference frame MF. The heat shield 20 may be arranged to at least partially surround the reference frame MF. The shield 20 may be mounted on the reference frame MF. Alternatively it may be mounted on the base frame BF. It is possible to mount the shield 20 on the reference frame MF since its thermal conditioning function is carried out in a passive way, that is, the functioning of the shield 20 does not cause mechanical vibrations to be generated in the apparatus. The heat shield 20 may be substantially in the form of a plate or plate-like structure. Typically, the heat shield 20 comprises at least a partially reflective surface, arranged to reflect radiation away from the reference frame MF. The reflective surface may be provided by a coating of a reflective material such as gold or nickel. Alternatively, a reflective surface may be formed by polishing or surface treating the heat shield. In one embodiment, the heat shield 20 is arranged to selectively shield portions of the reference frame MF. It has been found that those portions of the reference frame exhibiting an increased stiffness with respect to other portions of the reference frame MF, benefit especially from the increased thermal stability afforded by the heat shield 20. Whereas with reference to FIG. 2, the heat transport system for the projection system HT-PL is located adjacent the projection lens, the heat transport system of the reference frame HT-MF is arranged to be in thermal interaction with the heat radiation shield 20 for transporting heat to or from the reference frame MF. In this way heat is transported to or from the reference frame MF via the heat shield 20. As mentioned above, alternatively, the heat transport system 22, 24 may, at least in part, be integrally formed in the heat shield 20. As well as being disposed with respect to the upper and lower surfaces of the reference frame MF, the heat shield 20 may also be disposed with respect to that part of the reference frame MF which interfaces with the projection system PL. In this particular embodiment, it may be advantageous to limit the capacity of the heat transport system with respect to the heat shield 20.

Figure 4:
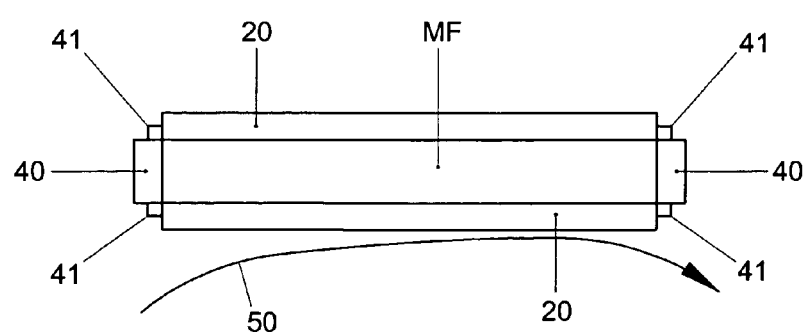
FIG. 4 depicts details of a lithographic apparatus shown in FIG. 1 according to a further embodiment of the present invention.

FIG. 4 depicts details of the lithographic apparatus shown in FIG. 1 according to a further embodiment of the present invention. Whereas in vacuum conditions, the heat shields protect the reference frame MF from radiation, in atmospheric conditions in addition to radiation, convection is present. To address this problem, in a particular embodiment, the heat transport system 200, comprising elements 202, 204, 40, and 41 is adapted to comprise a plurality of heat shields arranged to surround at least a portion of the reference frame MF. In particular, the heat shields, which are substantially similar to the heat shields 17, 20 discussed above, include a top flow plate 202 arranged to surround at least a portion of an upper surface of the reference frame MF, a bottom flow plate 204 arranged to surround at least a portion of a lower surface of the reference frame MF and at least one side flow plate 40 arranged to surround at least a side portion of the reference frame MF. In one embodiment, the heat transport system 200 is arranged to substantially enclose a volume of a thermally insulating material between the reference frame MF and the heat transport system to act as a thermal damper. In one embodiment, the heat transport system 200 is arranged to provide a volume of gas. A gas, for example, air is chosen because of its poor thermal conductivity. Alternatively, other materials including, for example, a volume of foam or other thermally insulating substance, may be provided. In the embodiment where a volume of gas is used, the enclosure may be gas tight, however, this is not essential. For example, when the flow restriction between the heat shield 200 and the reference frame MF is large enough, so that the gas enclosure may exhibit some leakage, the thermal damper principle still functions effectively. The thermal damper functions primarily by preventing gas from being refreshed with fresh gas, since this would lead to thermal heat load fluctuations. The heat shield may be closed at the sides, thus preventing the gas flow from getting between the plate and the reference frame MF. The gas gap, for example, air, between the reference frame MF and the flow plate 20, 40, 41 functions as thermal isolation. Furthermore, the thermal capacity of the flow plate itself functions as a thermal damper, as mentioned. In this way, the dynamic heat load towards the reference frame MF are damped significantly. Further, the flow plates may be passive or active or passive and active conditioned. In FIG. 4, arrow 50 illustrates a possible air flow direction.

While specific embodiments of the invention have been described above, it will be appreciated that the invention may be practiced otherwise than as described. The description is not intended to limit the invention.

What is claimed is:

1. A lithographic apparatus, comprising:
   an illumination system constructed to provide a beam of radiation;
   a support structure constructed to support a patterning device, said patterning device serving to impart a cross-section of said beam with a pattern to form a patterned beam of radiation;
   a substrate table for holding a substrate;
   a projection system that projects said patterned beam onto a target portion of said substrate;
   a reference frame, with a position sensor and said substrate being located on said reference frame;
   a heat transport system having a heating element in thermal interaction with at least one of said projection system and said reference frame for heat transport to or from at least one of said projection system and said reference frame; and
   a further frame on which said reference frame is mounted, wherein said further frame is provided with a vibration isolation system having a vibration damper adapted to prevent vibrations in said further frame from affecting said reference frame, and said heat transport system being coupled to said further frame.

2. A lithographic apparatus according to claim 1, wherein said further frame defines at least a part of a vacuum chamber in which at least one of said projection system and said reference frame are located.

3. A lithographic apparatus according to claim 1, further comprising:
   at least one heat radiation shield, located to intercept heat radiation to or from at least a part of a surface of said reference frame and wherein said heat radiation shield is mounted on said further frame.

4. A lithographic apparatus according to claim 1, wherein said heat transport system comprises a supply element and an abduction element for supplying and abducting, respectively, a fluid for transporting heat to or from at least one of said reference frame and said projection system.

5. A lithographic apparatus according to claim 4, wherein at least one of said supply, abduction, thermo-electric and heating elements are mounted on said further frame.

6. A lithographic apparatus according to claim 5, wherein said plurality of heat shields include a top flow plate arranged to surround at least a portion of an upper surface of said reference frame, a bottom flow plate arranged to surround at least a portion of a lower surface of said reference frame and at least one side flow plate arranged to surround at least a side portion of said reference frame.

7. A lithographic apparatus, comprising:
   an illumination system constructed to provide a beam of radiation;
   a support structure constructed to support a patterning device, said patterning device serving to impart a cross-section of said beam with a pattern to form a patterned beam of radiation;
   a substrate table for holding a substrate;
   a projection system that projects said patterned beam onto a target portion of said substrate;
   a reference frame, with a position sensor and said substrate being located on said reference frame; and
   a heat transport system having a heating element in thermal interaction with said reference frame for heat transport to or from said reference frame.

8. A lithographic apparatus according to claim 7, further comprising:
   a vacuum chamber enclosing at least one of sad said support structure, said substrate table, said projection system, and said reference frame.

9. A lithographic apparatus according to claim 7, further comprising:
   at least one heat radiation shield, located to intercept heat radiation to or from at least a part of a surface of said reference frame.

10. A lithographic apparatus according to claim 9, wherein
    said heat radiation shield is arranged to at least partially surround said reference frame.

11. A lithographic apparatus according to claim 9, wherein said heat radiation shield is mounted on said reference frame.

12. A lithographic apparatus according to claim 9, wherein
    said heat radiation shield is a plate.

13. A lithographic apparatus according to claim 9, wherein
    said heat radiation shield comprises at least a partially reflective surface, arranged to reflect radiation away from said reference frame.

14. A lithographic apparatus according to claim 9, wherein
    said heat radiation shield is arranged to shield a part of said reference frame which exhibits a stiffness which is high in relation to another part of said reference frame.

15. A lithographic apparatus according to claim 9, wherein
    said heat transport system is in thermal interaction with said heat radiation shield for transporting heat to or from said reference frame via said heat radiation shield.

16. A lithographic apparatus according to claim 9, wherein
    said heat radiation shield is provided with at least one of a thermo-electric element and a heating element, wherein said heating element comprises a cold medium and a heat pipe to condition said heat radiation shield.

17. A lithographic apparatus according to claim 7, wherein
    at least a part of a surface of said reference frame has at least a partially reflective surface.

18. A lithographic apparatus according to claim 7, wherein
    said heat transport system comprises a plurality of heat shields arranged to surround at least a portion of said reference frame.

19. A lithographic apparatus according to claim 18, wherein
    said heat transport system is arranged to substantially enclose a volume of a thermally insulating substance between said reference frame and said heat transport system to act as a thermal damper.

20. A lithographic apparatus according to claim 18, wherein
    said heat transport system is structurally adapted to be at least one of passive and active conditioned.

21. A lithographic apparatus according to claim 7, wherein
    said position sensor is directed to at least one of said patterning device and said substrate.

22. A method of manufacturing a device comprising:
providing a substrate;
providing a beam of radiation;
imparting a cross-sectional pattern to the beam and forming a patterned beam of radiation;
projecting the patterned beam of radiation onto a target portion of the substrate using a projection system supported by a reference frame, which is, in turn, supported by further frame;
using a vibration isolation system to prevent vibrations in the further frame from affecting the reference frame; and
transporting heat to or from at least one of the projection system and the reference frame using a heat transport system arranged to be in thermal interaction with at least one of the projection system and the reference frame.

23. A method of manufacturing a device, comprising:
providing a substrate;
providing a beam of radiation;
imparting a cross-sectional pattern to the beam and forming a patterned beam of radiation;
projecting the patterned beam of radiation onto a target portion of the substrate using a projection system supported by a reference frame; and
transporting heat to or from the reference frame using a heat transport system arranged to be in thermal interaction with the reference frame.

24. A lithographic apparatus, comprising:
an illumination system having a lens and providing a beam of radiation, said projection beam having a cross-section;
a support structure supporting a patterning device, said patterning device serving to impart said cross-section of said beam with a pattern and forming a patterned beam;
a substrate table for holding a substrate;
a projection system that projects said patterned beam onto a target portion of said substrate;
a vacuum chamber enclosing at least one of said support structure, said substrate table, and said projection system; and
a base frame on which at least one of a plurality of components of said apparatus which may cause motion or heat to be generated in said apparatus, is mounted,
wherein said base frame defines at least a part of said vacuum chamber.

25. A lithographic apparatus comprising:
means for providing a beam of radiation;
means for imparting the beam with a predetermined cross-sectional pattern to form a patterned beam;
a substrate;
means for projecting the patterned beam onto a target portion of said substrate;
a reference frame on which at least one position sensor for at least one of said means for forming a patterned beam and said substrate, and said means for projecting being located; and
means for transporting heat to or from said reference frame.

* * * * *